(12) United States Patent
Kajiya et al.

(10) Patent No.: US 9,024,184 B2
(45) Date of Patent: May 5, 2015

(54) SEALING STRUCTURE

(75) Inventors: Atsushi Kajiya, Tokyo (JP); Hidekazu Yoshihara, Tokyo (JP)

(73) Assignee: Nippon Mektron, Ltd., Minato-Ku (JP)

( * ) Notice: Subject to any disclaimer, the term of this patent is extended or adjusted under 35 U.S.C. 154(b) by 172 days.

(21) Appl. No.: 13/878,830

(22) PCT Filed: Jul. 28, 2011

(86) PCT No.: PCT/JP2011/067288
§ 371 (c)(1),
(2), (4) Date: Apr. 11, 2013

(87) PCT Pub. No.: WO2012/053269
PCT Pub. Date: Apr. 26, 2012

(65) Prior Publication Data
US 2013/0194735 A1    Aug. 1, 2013

(30) Foreign Application Priority Data

Oct. 20, 2010    (JP) .................. 2010-235588

(51) Int. Cl.
*H05K 5/00*    (2006.01)
*H05K 5/06*    (2006.01)
*F21V 8/00*    (2006.01)

(52) U.S. Cl.
CPC .............. *H05K 5/061* (2013.01); *G02B 6/0095* (2013.01)

(58) Field of Classification Search
CPC .................................................... H05K 5/061
USPC ............ 174/50.5; 361/679.01, 752, 749, 699; 362/294
See application file for complete search history.

(56) References Cited

U.S. PATENT DOCUMENTS

| | | | | |
|---|---|---|---|---|
| 3,993,938 A | * | 11/1976 | Marien et al. | 361/518 |
| 4,577,056 A | * | 3/1986 | Butt | 174/50.5 |
| 5,646,649 A | * | 7/1997 | Iwata et al. | 345/173 |
| 5,845,803 A | * | 12/1998 | Saito et al. | 220/378 |
| 5,877,695 A | | 3/1999 | Kubes et al. | |

FOREIGN PATENT DOCUMENTS

| | | |
|---|---|---|
| JP | 2001-036262 A1 | 2/2001 |
| JP | 2001-519591 A1 | 10/2001 |
| JP | 2002-042536 A1 | 2/2002 |
| JP | 2003-142836 A1 | 5/2003 |

(Continued)

OTHER PUBLICATIONS

International Search Report dated Oct. 4, 2011.

(Continued)

*Primary Examiner* — Dhirubhai R Patel (57) ABSTRACT

A sealing structure to seal a housing for electronic equipment such as a cellular phone, and which provides reliable sealing for the housing, and at the same time can attain to improve design with a simple construction. A sealing structure, which seals a housing, is provided with a seal member mounted on the housing, a substrate integrally molded with the seal member, and having at least a part thereof lying in the inside of the housing in a state where the seal member is mounted on the housing, and a light source element arranged on the substrate board, wherein the seal member is transparent or translucent, and it is constructed such that the light source element is arranged in a region of hermetic sealing formed by the seal member, whereby at least a part of the seal member emits light by the light radiated from the light source element.

9 Claims, 8 Drawing Sheets

(56) References Cited

FOREIGN PATENT DOCUMENTS

| JP | 2004-214927 A1 | 7/2004 |
| JP | 2004-228238 A1 | 8/2004 |
| JP | 2006-019812 A1 | 1/2006 |
| JP | 2006-290960 A1 | 10/2006 |

OTHER PUBLICATIONS

Japanese Office Action (Application No. 2010-235588) dated Sep. 16, 2014.

* cited by examiner

SEALING STRUCTURE

FIELD OF THE INVENTION

The present invention relates to a sealing structure which is used for a housing of electronic equipment such as a cellular phone, a notebook PC, and so on. More specifically, the invention relates to a sealing structure which is capable of improving the design features of goods so as to attain the differentiation thereof from other goods, by the provision of an illumination.

BACKGROUND OF THE INVENTION

In the past, electronic equipment such as a cellular phone, a notebook PC or the like has housings which serve to receive electronic parts, a substrate board, etc., and moreover, these housings are provided with a sealing structure for preventing water from entering the interior of the housings from outside. As a means for sealing the housings, there is known, for example, a technique of filling a gap between the housings and gaps between the substrate board, which is inserted into the housings, and these housings with an adhesive, a binder, etc. However, in this case, once the housings are disassembled at the time of maintenance of the electronic equipment, there is a problem that the reassembling of them becomes difficult.

Accordingly, in a first patent document, there is disclosed a structure in which the individual housings are coupled or joined with each other by means of a housing joint portion, after which the substrate board is inserted into the housing joint portion. In addition, in a second patent document, there is disclosed a structure in which a bush shaped seal member is mounted on a substrate board which has terminals formed at its tip.

PRIOR ART REFERENCES

Patent Documents

First Patent Document: Japanese patent application laid-open No. 2003-142836
Second Patent Document: Japanese patent application laid-open No. 2004-214927

SUMMARY OF THE INVENTION

Problems to be Solved by the Invention

However, in the above mentioned conventional sealing structures, there are the following problems. In recent years, users' design preferences and requirements to electronic equipment such as a cellular phone, a smart phone, electronic paper, an electronic notebook, or a portable music reproduction device, etc., are increasing, and in order to meet these requirements, electronic devices and equipment have been proposed which can attain improvement in design and differentiation of goods by adding illumination. For example, a technique is known in which light of LEDs is guided onto the outer surfaces of housings of these electronic equipment so as to provide light emission as illumination.

In this case, however, it is necessary to separately provide a structure for guiding the light from a light source to the housing outer surfaces as illumination, and hence, the further separate addition of the structure for illumination in addition to the provision of the sealing structure will cause complication and enlargement of the structure of electronic equipment.

Accordingly, the present invention has for its object to provide a sealing structure which is to seal a housing of electronic equipment such as a cellular phone, and which is capable of hermetically sealing the housing in a reliable manner and at the same time attaining an improvement in design with a simple construction.

Means for Solving the Problems

In order to achieve the above mentioned object, the present invention resides in a sealing structure which serves to seal a housing, and which is characterized by comprising:
a seal member that is mounted on said housing;
a substrate board that is integrally molded with said seal member, and has at least a part thereof lying in the inside of said housing in a state where said seal member is mounted on said housing; and
a light source element that is arranged on said substrate board;
wherein said seal member is transparent or translucent, and it is constructed such that said light source element is arranged in a region of hermetic sealing formed by said seal member, whereby at least a part of said seal member emits light by the light radiated from said light source element.

According to such a construction, the seal member is transparent or translucent, and the light source element is arranged in the region of hermetic sealing formed by the seal member, as a result of which the light radiated or emitted from the light source element is taken into the interior of the seal member, whereby at least a part of the seal member can be made to emit light. Therefore, it becomes possible to seal the housing in a reliable manner, and at the same time, it also becomes possible to attain improvement in design as well as differentiation of goods with a simple construction. In addition, the seal member and the substrate board are integrally molded together, and besides, the light source element is arranged on the substrate board, as a result of which it is possible to position the light source element and the seal member with a high degree of accuracy, and hence it is possible to guide the light emitted from the light source element into the interior of the seal member in an effective manner. Moreover, because the seal member and the substrate board are integrally molded together, it is not necessary to bend the seal member for the purpose of mounting the substrate board, thus making it possible to suppress the local emission of light occurring in bent portions of the seal member.

In addition, in the present invention, it is preferable that said seal member be formed into a frame shape which is formed along an outer periphery of the housing, and at the same time, have a reflective part which is able to reflect the light incident to the interior of said seal member from said light source element thereby to change the direction of movement thereof along the shape of said seal member.

According to such a construction, by reflecting the light incident to the interior of the seal member in the reflective part, it is possible to cause a wide range of the frame shaped seal member to emit light. For example, by forming the reflective part in a curved portion of the seal member, it is possible to cause the seal member to emit light over its entire periphery. In addition, by the provision of the reflective part, it is possible to cause the wide range of the seal member to emit light by the light source element composed of a small number of light source element parts, so it is possible to attain a reduction in the number of parts as well as a reduction in the cost of production.

Moreover, in the present invention, it is preferable to construct such that a light guide part be formed on said seal member in such a manner that the light emitted from said light source element is taken into the interior of said seal member from said light guide part.

According to such a construction, by the provision of the light guide part in the seal member, it becomes possible to take the light emitted from the light source element into the interior of the seal member in an effective manner.

Further, in the present invention, it is preferable that a recess be formed in said seal member, and that said light source element be arranged on said substrate board and in said recess.

According to such a construction, by arranging the light source element in the recess formed in the seal member, it becomes possible to take the light emitted from the light source element into the interior of the seal member in an effective manner. In addition, by the arrangement of the light source element in the recess, it is possible to make electronic equipment and connectors thin and compact.

Furthermore, in the present invention, it is preferable that said light source element be embedded in said seal member on said substrate board.

According to such a construction, there is no interface existing between the light source element and the seal member, and hence, it is possible to take the light emitted from the light source element into the interior of the seal member in a more effective manner, so that the seal member can be made to emit light efficiently.

In addition, in the present invention, said seal member is characterized by being rubber or elastomer, which has self adhesiveness.

According to such a construction, the mountability of the seal member with respect to the housing is improved, and beside this, even if the housing is once disassembled, for example, at the time of maintenance or the like, the housing can be assembled again together with the seal member. In addition, integration or unification between the seal member and the substrate board can be carried out in a more reliable manner, so that it becomes difficult for a gap to be formed between the housing and the substrate board, thus making it possible to improve the water proof function of the housing.

Moreover, in the present invention, it is preferable that said rubber or elastomer having self adhesiveness be self-adhesive silicone rubber, liquid fluororubber, liquid ethylene propylene rubber, or urethane based elastomer.

According to this, integration or unification between the seal member and the substrate board can be carried out in a more reliable manner. In addition, when self-adhesive silicone rubber is used, heat resistance, cold resistance, water repellence, and electric insulation are improved. Moreover, when liquid fluororubber is used, heat resistance is improved, and when liquid ethylene propylene rubber is used, a reduction in the production costs can be attained. Also, when urethane based elastomer is used, wear resistance and electric insulation are improved.

Further, in the present invention, it is preferable that said light source element be able to emit light in a plurality of colors.

According to this, the luminescent color of the seal member can be changed in an easy manner, so that it becomes possible to attain improvement in design as well as differentiation of goods.

Furthermore, in the present invention, it is preferable that said substrate board be a flexible wiring board.

According to this, the thickness of the substrate board can be made thin, so that it becomes possible to attain the reduction in size of the sealing structure. In addition, in cases where the substrate board is inserted through the housing, it is possible to provide hermetic sealing between the housing and the substrate board in a more reliable manner, so that it becomes possible to improve the waterproof performance of the sealing structure.

Effect of the Invention

As described above, according to the present invention, it becomes possible to provide a sealing structure which serves to seal a housing for electronic equipment such as a cellular phone, and which can hermetically seal the housing in a reliable manner, and at the same time can attain improvement in design with a simple construction.

DETAILED DESCRIPTION OF THE INVENTION

Hereinafter, modes for carrying out the present invention will be described in detail by way of example with reference to the attached drawings. However, the dimensions, materials, shapes, relative arrangements and so on of component parts described in the following embodiments are not intended to limit the scope of the present invention to these alone in particular as long as there are no specific statements.

[First Embodiment]

(1-1: Schematic Construction of Sealing Structure)

Figure 1A:
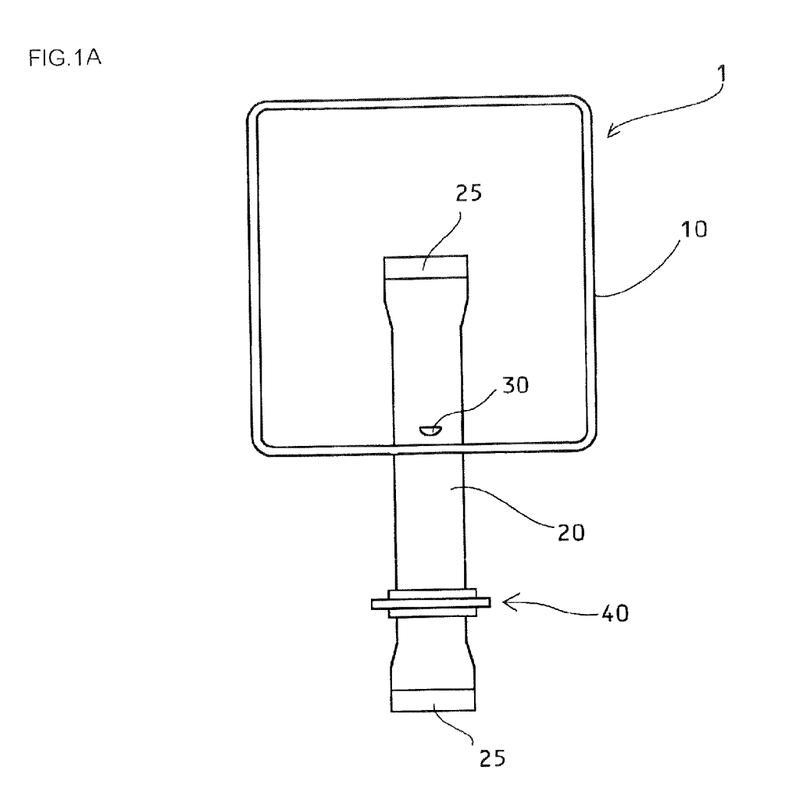
FIGS. 1A and 1B are schematic construction views of a sealing structure.
Figure 1B:
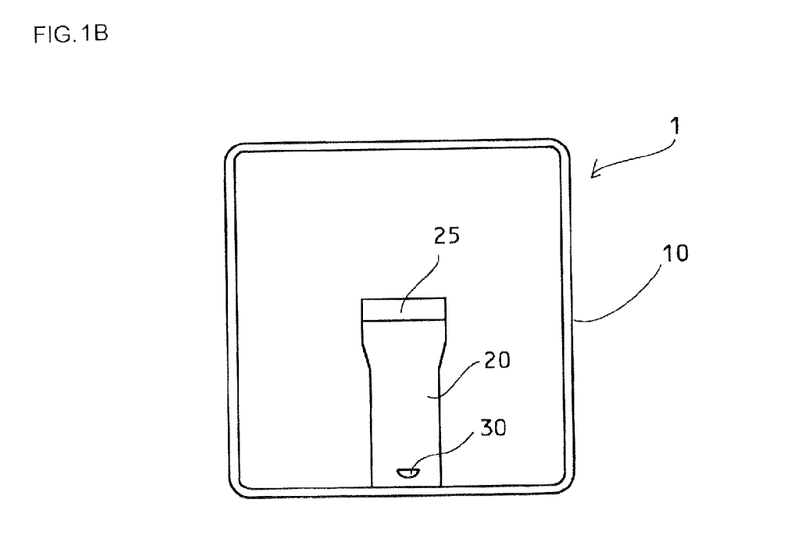

Reference will be made to the schematic construction of a sealing structure according to this first embodiment of the present invention, while referring to FIGA. 1A and 1b. FIGS. 1A and 1B are schematic construction views of a sealing structure 1 according to this first embodiment of the present invention.

As shown in FIG. 1A, the sealing structure 1 has a flexible wiring board 20, and seal members 10, 40 which are arranged at the opposite sides of the flexible wiring board 20, respectively. In addition, the flexible wiring board 20 is provided at the opposite ends thereof with connectors 25, and it is constructed such that the connectors 25 are able to be electrically connected to electrical component parts in individual housings, respectively.

One seal member 10 is integrally molded with the flexible wiring board 20, and is formed to be transparent or translucent. Here, note that the term "transparent" referred to herein means just to have optical transparency to such an extent as to enable light to be transmitted to the outside of housings through the seal member 10, but does not strictly mean colorless transparent. Materials which can be applied to the seal member 10 will be described later.

This seal member 10 is a frame shaped seal member, and serves to seal a pair of opposed housings by being mounted between the housings. In a state where the seal member 10 is mounted on the housings, a gap between the housings and gaps between the housings and the flexible wiring board 20 can be closed at the same time by means of the seal member 10. In addition, the other seal member 40 is a bush shaped seal member, and is able to seal a housing by being mounting on an insertion hole formed in the housing.

The seal member 10 is integrally molded with the flexible wiring board 20, and hence, at the time when the sealing structure 1 is mounted on the housings, the mountability of the sealing structure 1 in this embodiment is improved, as compared with a case where the seal member and the substrate board are separately mounted on the housings. In addition, because there is no gap formed between the seal member 10 and the flexible wiring board 20, the waterproof performance of the sealing structure 1 in this embodiment can be improved, as compared with the case where both the seal member 10 and the flexible wiring board 20 are formed separately from each other.

In particular, in cases where the flexible wiring board 20 is used as the substrate board, as in this embodiment, the flexible wiring board 20 is thinner and more excellent in deformability in comparison with other substrate boards, and hence, it is more difficult for a gap to be formed between the flexible wiring board 20 and the seal member 10, thus making it possible to enhance the waterproof performance of the sealing structure 1.

Here, note that description is herein made about the construction in which the frame shaped seal member 10 and the bush shaped seal member 40 are arranged at the opposite sides of the flexible wiring board 20, but the construction of the sealing structure 1 according to this embodiment is not limited to this. That is, both of the seal members are frame shaped seal members, or the sealing structure may be provided with only a single seal member, or three or more seal members. In other words, it is possible to change the construction of the sealing structure 1 in an appropriate manner so as to meet the construction of housings which are to be hermetically sealed.

In addition, in FIG. 1A, there is shown the sealing structure 1 of the type in which the flexible wiring board 20 is inserted through the housings, but the sealing structure 1 may be of other types in which the flexible wiring board 20 is not inserted through the housings, as shown in FIG. 1B. That is, the flexible wiring board 20 should just has at least a part thereof lying in the inside of the housings in a state where the seal member 10 is mounted on the housings, but is not necessarily limited to the form in which the flexible wiring board 20 is inserted through the housings.

Next, reference will be made to a light source element which is arranged or mounted on the flexible wiring board 20. On the flexible wiring board 20, there is mounted an LED (light emitting diode) 30 as the light source element. The LED 30 is arranged in such a manner that it exists in a hermetic seal region of the seal member 10 in a state where the sealing structure 1 is mounted on the housings.

By arranging the LED 30 in this manner, it is possible to cause at least a part of the seal member 10 to emit light by means of the light radiated or emitted from the LED 30. Further, if the LED 30 is arranged in the vicinity of the seal member 10, it will become possible to take the light emitted from the LED 30 into the interior of the seal member 10 in a more efficient manner.

In addition, the flexible wiring board 20 and the seal member 10 are integrally molded with each other, as stated above, and so, in comparison with a case where these are mounted separately from each other, it is easy to maintain the positional accuracy of the seal member 10 and the LED 30 at a high level. As a result, it becomes possible to take the light emitted from the LED 30 into the interior of the seal member 10 in an effective manner.

(1-2: Construction for Causing Seal Member to Efficiently Emit Light)

In order to decrease the number of LEDs 30 as much as possible and to cause the seal member 10 to emit light over a wide range, it is desirable to provide reflective parts for changing the direction of movement of the light which has come into the interior of the seal member 10 from the LED 30. The construction of the reflective parts in this first embodiment will be described with reference to FIG. 2.

Figure 2:
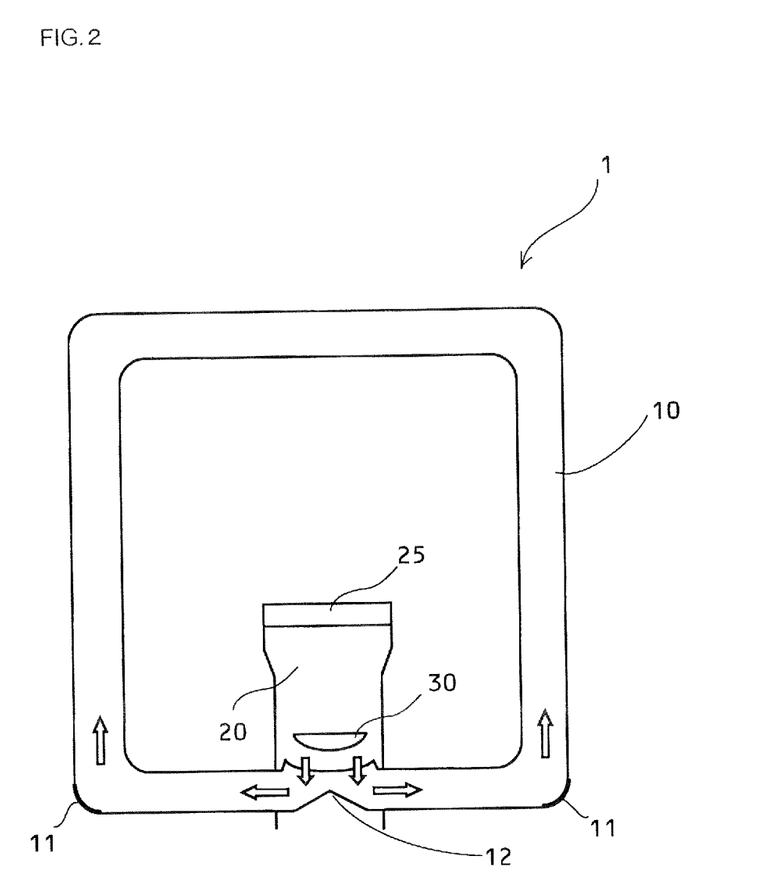
FIG. 2 is a schematic construction view of a sealing structure according to a first embodiment of the present invention.

FIG. 2 is a view for explaining the reflective parts 11, 12 which are provided or arranged in the seal member 10. As shown in this figure, the seal member 10 has the reflective part 12 that is arranged in a portion thereof into which the light from the LED 30 is incident, and the reflective parts 11 that are arranged in curved portions of the frame shaped seal member 10.

Here, note that in cases where a light emitting part of the LED 30 is distant from the seal member 10, a part of the seal member 10 may be extended in a direction toward the LED 30, as shown in the above figure. Moreover, a recess or concave portion may be formed in the portion of the seal member 10 into which the light from the LED 30 is incident, in a manner so as to enclose the light emitting part of the LED 3. Also, note that the reflective parts 11 may be arranged in four corners of the seal member 10.

The reflective part 12 is arranged in a position opposing to a light emitting surface of the LED 3, and is formed in the shape of an inclined surface, so that the light can be reflected in a direction along the shape of the seal member 10 (in the direction of an arrow in the above figure). In addition, the reflective parts 11 are arranged in the curved portions of the seal member 10, and serves to change the direction of movement of the light reflected by the reflective part 12 so that the light can go along the shape of the seal member 10.

By the provision of the reflective parts 11, 12 in the seal member 10 in this manner, it becomes possible to take the light radiated or emitted from the LED 30 into the interior of the seal member 10 in an effective manner. Here, note that the individual reflective parts are formed by means of mirror surface finishing, but the processing method of the reflective parts is not limited in particular as long as light can be reflected inside the seal member 10. Though not shown in particular, in order to increase the efficiency of light incidence, the portion of the seal member 10 into which light is incident may be arranged in a position closer to the LED 30, or the thickness of that portion into which light is incident may be made thicker. Alternatively, an area extending from the LED 30 to the portion of the seal member 10 into which light is incident may be overcoated with a transparent resin, or may be stuck or pasted with a reflective film or the like.

(1-3: Construction of Flexible Wiring Board)

Figure 7:
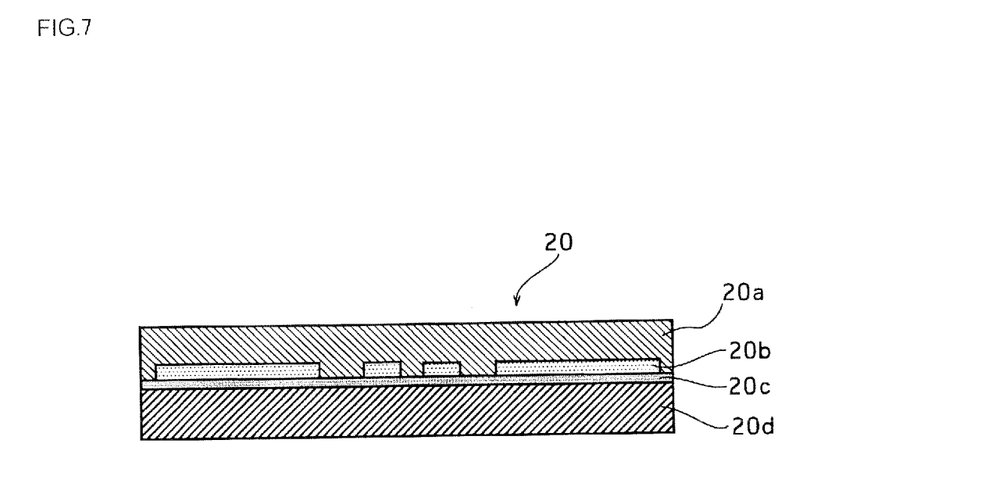
FIG. 7 is a schematic cross sectional view of a flexible wiring board in the present invention.

The construction of the flexible wiring board 20 will be described with reference to FIG. 7. FIG. 7 is a schematic cross sectional view of the flexible wiring board 20.

The flexible wiring board 20 is composed of a base film 20*d* (substrate layer), a wiring pattern 20*b* (conductive layer)

which is formed on the base film 20d, and a surface protective insulating material 20a (insulating layer) which is formed on the wiring pattern 20b. Here, note that the wiring pattern 20b is adhered on the base film 20d by means of an adhesive layer 20c, but other constructions may be possible in which the adhesive layer 20c is not provided.

The wiring pattern 20b is formed by etching a metallic foil, such as a rolled copper foil, an electrolytic copper foil, or the like, which is stuck on the base film 20d by means of the adhesive layer 20c. Alternatively, the wiring pattern 20b can also be formed on a surface of the base film 20d (or a surface of the adhesive layer 20c formed on the base film 20d) by means of an appropriate method such as plating, printing, vapor deposition, sputtering, or the like, by using a metal such as copper or silver, or by using other conductors.

The adhesive layer 20c is formed by using a well-known thermoplastic resin such as polyimide, or a well-known thermosetting resin such as cyanate ester based resin, polyphenylene ether based resin, phenol based resin, naphthalene resin, urea resin, amino resin, alkyd resin, silicon resin, furan resin, unsaturated polyester resin, epoxy resin, polyurethane resin, etc. Alternatively, the adhesive layer 20c can also be formed of any of the above mentioned organic resins with an inorganic filler such as silica, alumina or the like dispersed therein.

Although materials, which can be applied as the base film 20d and the surface protective insulating material 20a, are not limited in particular, they may be a single kind of film which is selected from, or a laminated film which is formed by laminating a plurality of resin films which are selected from, polyimide, polyester, polyamide, polycarbonate, polyarylate, polyphenylene ether, poly phenylene sulphide, polyethersulfone, polyether imide, liquid crystal polymer, polyether ether ketone, cyclic polyolefin, polyamide imide, thermoplastic polyimide, polyethylene terephthalate, cycloolefin polymer. Here, note that it is preferable that the thicknesses of the base film 20d and the surface protective insulating material 20a be in the range of 5-200 μm, and it is particularly preferable that they be in the range of 5-100 μm. Also, note that although the flexible wiring board 20 has been described or exemplified as a single-sided structure, it is not limited to this, but it may be a double-sided structure and a multilayer structure. In the case of a multilayer structure, the flexible wiring board 20 may be a rigid-flex wiring board.

(1-4: Production Method of Sealing Structure)

Reference will be made to a production method in which the seal member 10 is integrally molded with respect to the above mentioned flexible wiring board 20 thereby to obtain the sealing structure 1.

First, materials which can be applied to the seal member 10 will be described. For the seal member 10, materials shoud just be flexible and transparent or translucent from the point of view of ease of handling, and the following materials can be applied or used: silicone rubber, fluororubber, ethylene propylene rubber, urethane based elastomer, ethylene propylene diene terpolymer, butyl rubber, butadiene styrene copolymer, crude rubber, isoprene rubber, chloroprene rubber, chlorosulfonated polyethylene rubber, acrylic rubber, acrylonitrile-butadiene rubber, butadiene rubber, styrene based thermoplastic elastomer, olefin based thermoplastic elastomer, vinyl chloride system thermoplastic elastomer, ester based thermoplastic elastomer, amide based thermoplastic elastomer, 1, 2-BR based thermoplastic elastomer, fluorine based thermoplastic elastomer, etc. In particular, even among these, materials having self adhesiveness are desirable, and self-adhesive silicone rubber, liquid fluororubber, liquid ethylene propylene rubber, or urethane based elastomer are preferable, and in cases where these materials are applied or used, integration or unification between the seal member 10 and the flexible wiring board 20 can be carried out in a more reliable manner, and at the same time, heat resistance, cold resistance, water repellence, and electric insulation are improved. Particularly, liquid fluororubber has good heat resistance, and liquid ethylene propylene rubber is able to be produced at low costs, and urethane based elastomer is good in wear resistance and electric insulation.

The sealing structure 1 is produced by directly pouring materials on the surface protective insulating material 20a of the flexible wiring board 20 which has been beforehand finished or formed into a target shape, by the use of a metal mold thereby to integrally mold the seal member 10. For the seal member 10, self-adhesive silicone rubber, which is self adhesive liquid rubber, can be used preferably, but the seal member 10 is not limited to this. As self-adhesive silicone rubber, there can be mentioned X-34-1277 A/B, X-34-1547 A/B, X-34-1464 NB, etc., which are manufactured by Shin-Etsu Chemical Co., Ltd. In addition, each of the frame shaped seal member 10 and the bush shaped seal member 40 can also be formed by fixedly securing by adhesion the opposite ends of a seal member to each other which is formed by the use of a metal mold. Furthermore, as other methods for producing the sealing structure 1, a seal member, which has been beforehand formed into the shape of a string by means of extrusion molding, etc., may be set in the shape of a frame, and then the opposite ends of the seal member may be fixedly secured by adhesion to the flexible wiring board 20, so that they are fixedly secured to each other. Here, the seal member formed in the shape of a string may be of a multiple layer structure which is composed of a core/ clad layer, such as that of an optical fiber, or may be of a tubular shape having a hollow interior. Also, note that the fixed securing of the seal member may be carried out not only by means of adhesion fixing, but also by means of fusion fixing or close contact securing (fixing).

As a method of causing the whole of the seal member 10 to emit light, a light scattering effect may be further facilitated by causing air bubbles or light scattering substances (e.g., lame, pieces of thread, titanium oxide, magnesium oxide, zinc oxide, etc.) to be contained in each of the above mentioned rubbers and elastomers. Moreover, the seal member 10 may be covered with a clad layer which is composed of a transparent resin having a low index of refraction, and the surface of this clad layer may be covered with a light diffusion or scattering sheet. In addition, dot processing may be carried out on the outer periphery of the seal member 10 by means of laser, or ink jet dot printing may be carried out thereon. Alternatively, it may be constructed such that the diffusion or scattering of light is facilitated by forming irregularities on the outer periphery of the seal member 10 at the time of molding of the seal member 10.

According to this production method, it is possible to obtain the sealing structure 1 which is able to seal the housings in a reliable manner with a simple and inexpensive construction. That is, it is possible to seal gaps between the mating surfaces of the housings as well as gaps between the housings and the flexible wiring board 20 in a reliable manner by means of the seal member 10.

Figure 8:
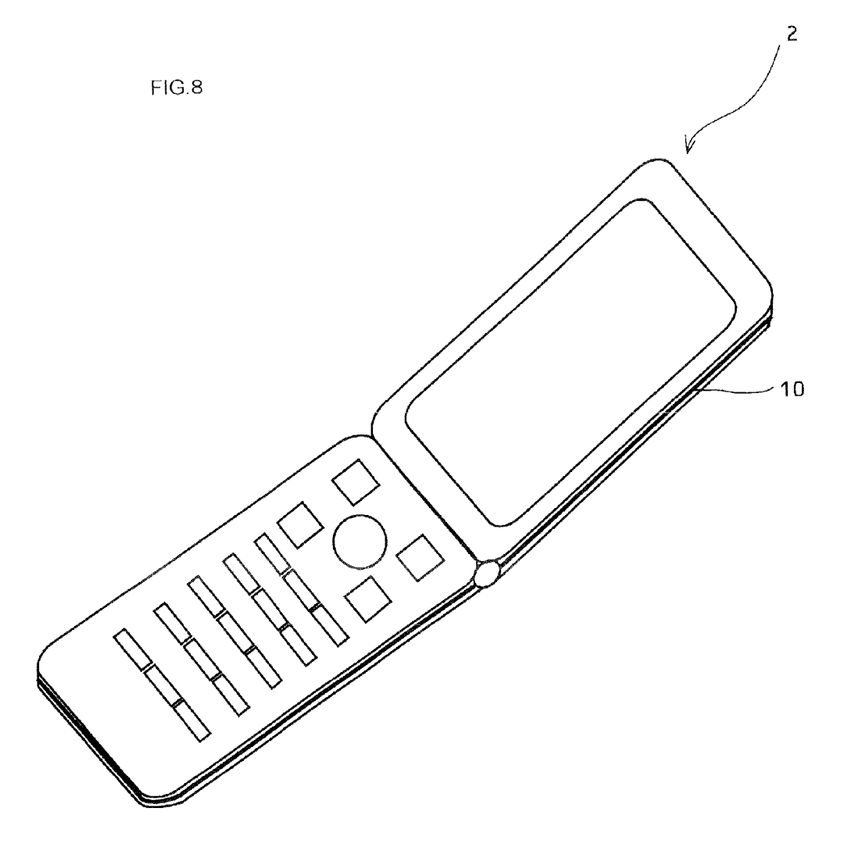
FIG. 8 is a schematic construction view of a cellular phone in the present invention.

Here, note that the sealing structure 1 can also be used for a housing 2 of a cellular phone, as shown in FIG. 8, for example. In addition, it can also be used for a connector housing. Moreover, as stated above, a variety of kinds of shapes in addition to the frame shape and the bush shape can be used for the shapes of the seal members, and the number of seal members provided for the flexible wiring board can be changed as necessary or appropriate according to the equipment or device to be targeted or used.

In this manner, according to this embodiment, it becomes possible to provide a sealing structure which serves to seal a housing for electronic equipment such as a cellular phone, and which can hermetically seal the housing in a reliable manner, and at the same time can attain improvement in design with a simple construction.

[Second Embodiment]

Figure 3:
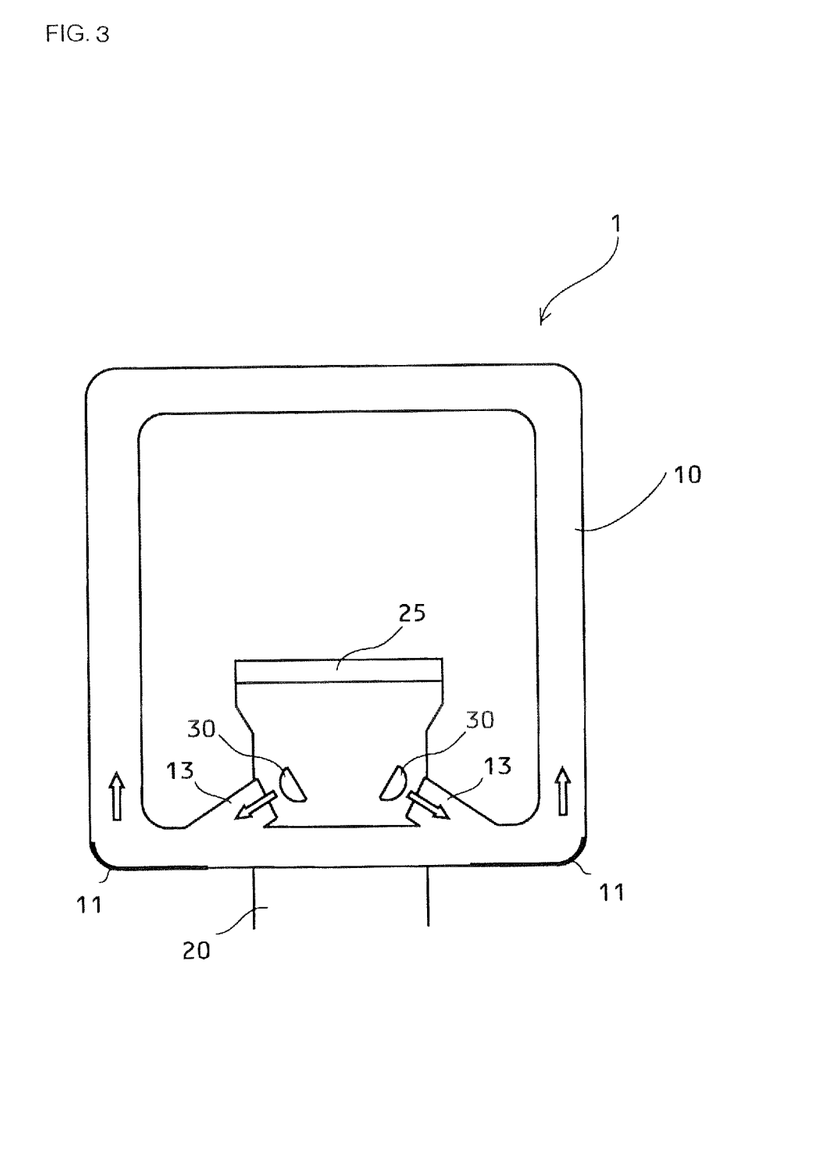
FIG. 3 is a schematic construction view of a sealing structure according to a second embodiment of the present invention.

Reference will be made to a sealing structure according to a second embodiment to which the present invention can be applied, while referring to FIG. 3. Here, note that description about the same construction of this second embodiment as that of the first embodiment is omitted, and only those which are different from the first embodiment will be described here.

(Construction for Causing Seal Member to Efficiently Emit Light)

This second embodiment is featured in that in order to take the light radiated or emitted from LEDs 30 into the interior of a seal member 10 in a more effective manner, the seal member 10 is provided with light guide parts 13. Two pieces of LEDs 30 are mounted on a flexible wiring board 20, and two light guide parts 13 are provided corresponding to the individual LEDs 30, respectively. In addition, the lights incident from the light guide parts 13 are reflected in directions along the shape of the seal member 10 in the reflective parts 11 in the seal member 10, respectively.

Here, note that although a construction provided with two LEDs 30 is described here, the number of LEDs 30 is not limited to this, but may be one. In addition, a reflective part of a cut shape, such as a wedge cut shape (e.g., one denoted at reference numeral 12 in FIG. 2), which has been described in the first embodiment, may be formed. By the provision of the light guide parts 13 in the seal member 10 in this manner, it is possible to take the lights radiated or emitted from the LEDs 30 into the interior of the seal member 10, while reducing leakage of the lights. As a result, in cases where the number of LEDs 30 is small, too, it becomes possible to cause the seal member 10 to emit light to a sufficient extent. Here, note that though not illustrated in particular, the thicknesses of the light guide parts 13 into which the lights are incident may be made thicker so as to further increase the efficiency of light incidence. Alternatively, an area extending from each of the LEDs 30 to a corresponding light guide part 13 may be overcoated with a transparent resin, or may be stuck or pasted with a reflective film.

As described above, according to this second embodiment, it becomes possible to provide a sealing structure which serves to seal a housing for electronic equipment such as a cellular phone, and which can hermetically seal the housing in a reliable manner, and at the same time can attain improvement in design with a simple construction.

[Third Embodiment]

Reference will be made to a sealing structure according to a third embodiment to which the present invention can be applied, while referring to FIGS. 4A and 4B. Here, note that description about the same construction of this third embodiment as those of the first and second embodiments is omitted, and only those which are different from the first and second embodiments will be described here.

(Construction for Causing Seal Member to Efficiently Emit Light)

Figure 4A:
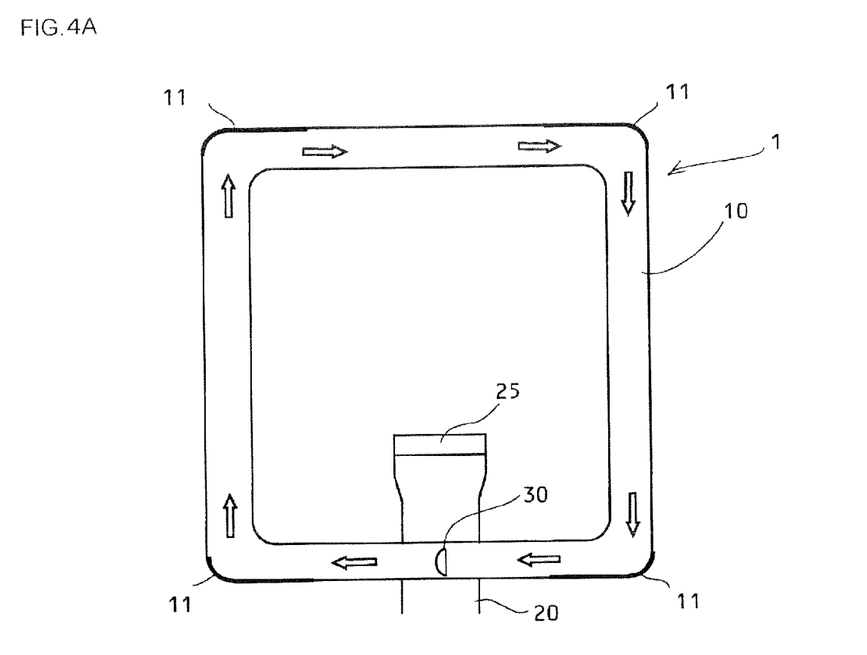
FIGS. 4A and 4B are schematic construction views of a sealing structure according to a third embodiment of the present invention.
Figure 4B:
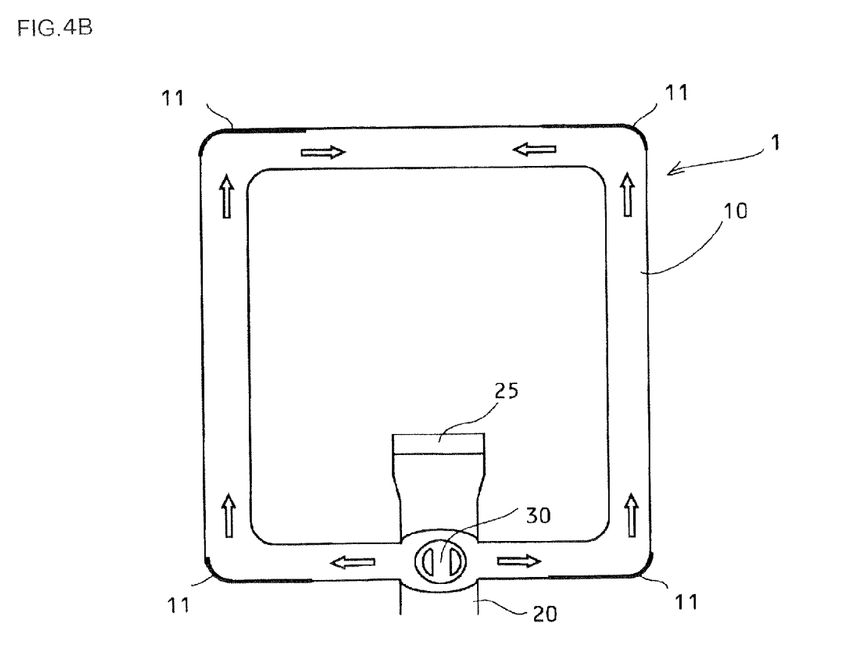

As shown in FIG. 4A, when the sealing structure 1 is seen from above, an LED 30 of this embodiment is arranged on a flexible wiring board 20 and inside the seal member 10. In addition, as shown in FIG. 4B, two LEDs 30 may be mounted in such a manner that they radiate or emit lights to the right and left, respectively. Here, note that a recess or recesses, though not shown, may be formed in the seal member 10, and in a production process, the flexible wiring board 20 and the seal member 10 may be integrally molded in such a manner that the LED(s) 30 can be arranged in the recess(es).

Figure 5A:
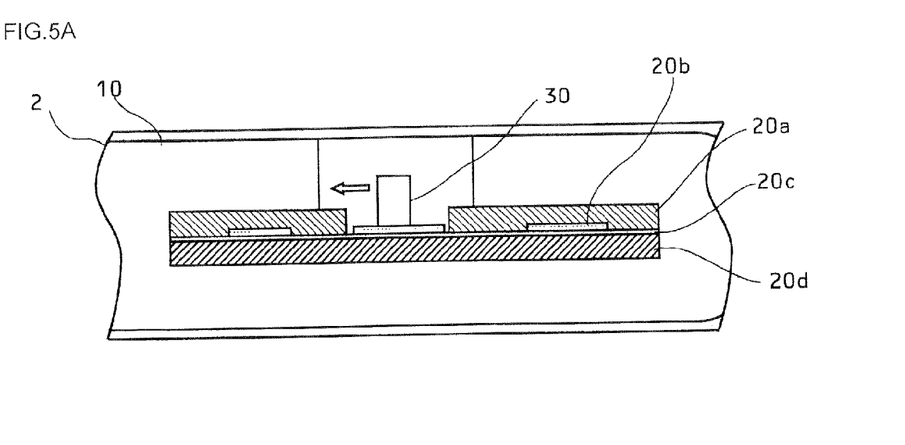
FIGS. 5A, 5B and 5C are schematic cross sectional views of a sealing structure according to a fourth embodiment of the present invention.
Figure 5B:
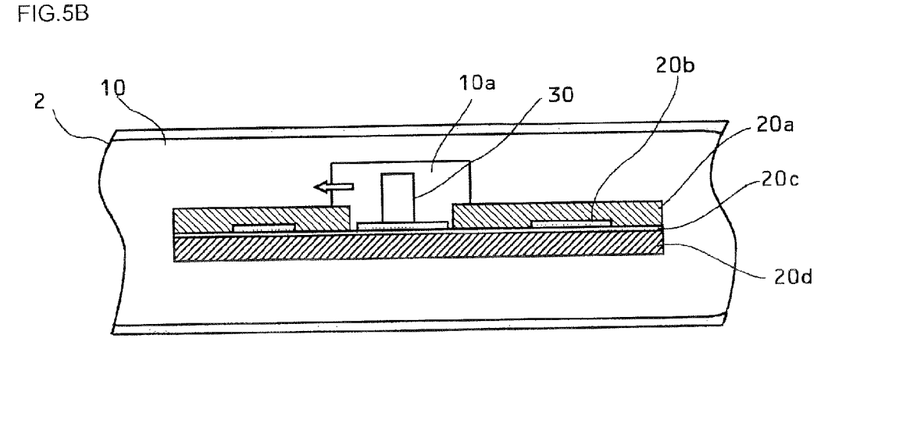
Figure 5C:
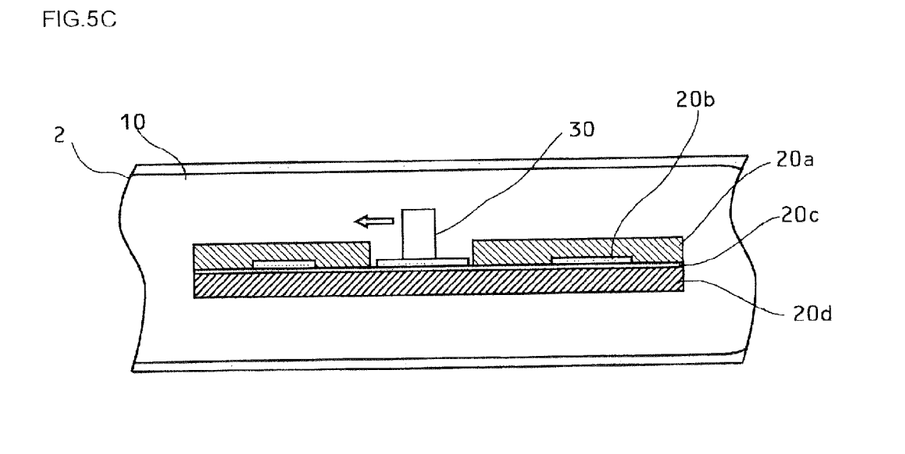

In FIGS. 5A, 5B and 5C, there is shown a schematic cross sectional view of a portion in the sealing structure 1, in which an LED 30 is mounted on the flexible wiring board 20 and the seal member 10 is formed. FIG. 5A shows a case where the LED 30 is arranged in an opening which is formed in the seal member 10. According to this arrangement, if the seal member 10 has a required heat resistance, it will also be possible to mount the LED 30 after the seal member 10 is formed. On the other hand, FIG. 5B shows a case where the LED 30 is arranged in a recess or concave portion which is formed in the seal member 10. According to this arrangement, it becomes possible to take the light emitted from the LED 30 into the interior of the seal member 10 in an effective manner. In addition, the mounting position of the LED 30 is not limited to this, but the LED 30 may instead be embedded in the seal member 10, as shown in FIG. 5C. According to this arrangement, there is no interface or boundary between a light emitting surface of the LED 30 and the seal member 10, as a result of which it becomes possible to take the light emitted from the LED 30 into the interior of the seal member 10 in a more effective manner.

In addition, as stated above, the frame shaped seal member 10 can also be formed by fixedly securing by adhesion the opposite ends of a string-like seal member to each other. In that case, if flat portions are formed on the end faces of the string-like seal member at the opposite ends thereof, and if the flexible wiring board 20 and the seal member 10 are integrally molded in such a manner that the LED 30 can be arranged in at least one of the flat portions, it will be possible to cause a large area of the seal member 10 to emit light, as illustrated.

As described above, according to this third embodiment, it becomes possible to provide a sealing structure which serves to seal a housing for electronic equipment such as a cellular phone, and which can hermetically seal the housing in a reliable manner, and at the same time can attain improvement in design with a simple construction.

[Fourth Embodiment]

Reference will be made to a sealing structure according to a fourth embodiment to which the present invention can be applied, while referring to FIGS. 6A and 6B. Here, note that description about the same construction of this fourth embodiment as those of the first through third embodiments is omitted, and only those which are different from the first through third embodiments will be described here.

(Construction for Causing Seal Member to Efficiently Emit Light)

Figure 6A:
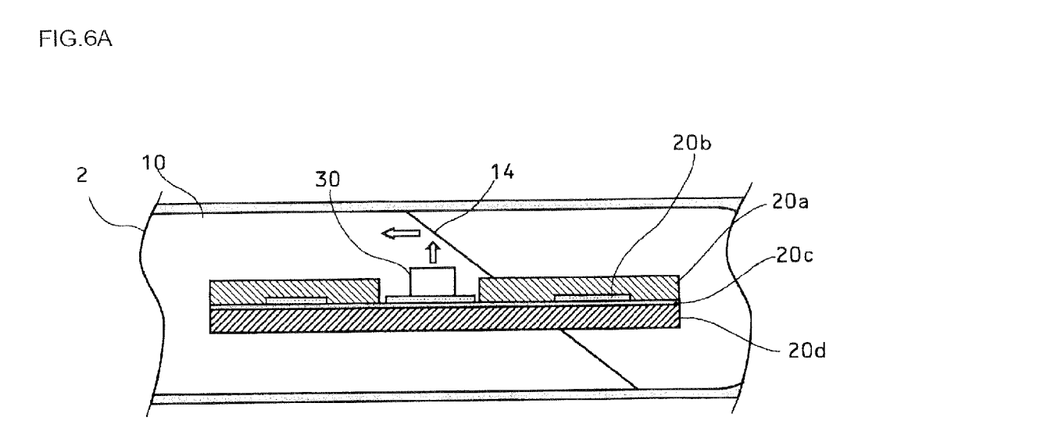
FIGS. 6A and 6B are schematic cross sectional views of a sealing structure according to the present invention.
Figure 6B:
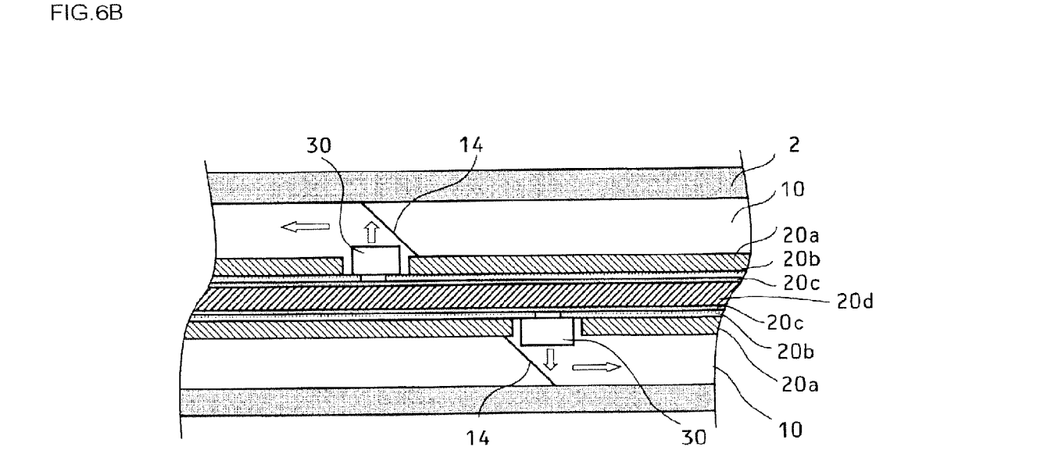

FIGS. 6A and 6B show a cross section of the sealing structure 1, wherein a state thereof where hermetic sealing between housings 2 is provided by means of a seal member 10 is shown.

As shown in FIG. 6A, here, an LED 30 is mounted on a flexible wiring board 20, in such a manner that the direction of emission of light from the LED is made to be substantially a normal line direction of the flexible wiring board 20.

Then, in order to cause the light emitted from the LED 30 to advance along the shape of the seal member 10, reflection processing is applied to the surfaces of inclined parts 14 which are formed on the end faces of opposite ends of the seal member 10, respectively. According to this, the light emitted from the LED 30 can be reflected on the inclined parts 14 which have a reflective function, thus making it possible to advance in the interior of the seal member 10.

Here, note that the number of LEDs 30 is not limited to one. For example, as shown in FIG. 6B, the flexible wiring board 20 may be made to be of a multiple layer structure, and LEDs 30 are mounted on the individual surfaces of an upper face and a lower face of the flexible wiring board 20, respectively, so that the lights radiated or emitted from the LEDs 30 can be reflected by inclined or sloped parts 14, respectively.

By making use of the inclined parts 14 formed at the end faces of the seal member 10 as a reflective part(s) in this manner, it is possible to guide the light(s) emitted from the LED(s) 30 into the seal member 10 with a simple construction. As a result, according to this fourth embodiment, it becomes possible to provide a sealing structure which serves to seal a housing for electronic equipment such as a cellular phone, and which can hermetically seal the housing in a reliable manner, and at the same time can attain improvement in design with a simple construction.

[Other Embodiments]

In the first through fourth embodiments, the description has been made about the case where the number of LEDs 30 is one or two, but the number of LEDs 30 is not limited to this. The number of LEDs 30 may also be further add or increased in order to satisfy requirements for design. In addition, it is not necessary to make the lights emitted from all the LEDs to be the same color, and the color of light may be changed according to each LED 30, or an LED 30 may be provided which is able to emit light in a plurality of colors.

EXPLANATION OF REFERENCE NUMERALS AND CHARACTERS

1 . . . sealing structure
2 . . . housing(s)
10 . . . seal member
11, 12 . . . reflective parts
13 . . . light guide parts
14 . . . inclined parts
20 . . . flexible wiring board
30 . . . LED(s)
40 . . . seal member

The invention claimed is:

1. A sealing structure which hermetically seals a housing, characterized by comprising:

a seal member that is mounted on said housing;
a substrate board that is integrally molded with said seal member, and has at least a part thereof lying in the inside of said housing in a state where said seal member is mounted on said housing; and
a light source element that is arranged on said substrate board;
wherein said seal member is transparent or translucent, and it is constructed such that said light source element is arranged in a region of hermetic sealing formed by said seal member, whereby at least a part of said seal member emits light by the light radiated from said light source element.

2. The sealing structure as set forth in claim 1, wherein said seal member is formed into a frame shape which is formed along an outer periphery of the housing, and at the same time, has a reflective part which is able to reflect the light incident to the interior of said seal member from said light source element thereby to change the direction of movement thereof along the shape of said seal member.

3. The sealing structure as set forth in claim 1, wherein said seal member is provided with a light guide part, and it is constructed such that the light emitted from said light source element is taken into said seal member from said light guide part.

4. The sealing structure as set forth in claim 1, wherein a recess is formed in said seal member, and said light source element is arranged on said substrate board and in said recess.

5. The sealing structure as set forth in claim 1, wherein said light source element is embedded in said seal member on said substrate board.

6. The sealing structure as set forth in claim 1, wherein said seal member is rubber or elastomer, which has self adhesiveness.

7. The sealing structure as set forth in claim 6, wherein said rubber or elastomer having self adhesiveness is self-adhesive silicone rubber, liquid fluororubber, liquid ethylene propylene rubber, or urethane based elastomer.

8. The sealing structure as set forth in claim 1, wherein said light source element is able to emit light in a plurality of colors.

9. The sealing structure as set forth in claim 1, wherein said substrate board is a flexible wiring board.

\* \* \* \* \*